(12) United States Patent
Okamoto et al.

(10) Patent No.: US 10,043,931 B2
(45) Date of Patent: Aug. 7, 2018

(54) SOLAR CELL MODULE AND SOLAR CELL MODULE MANUFACTURING METHOD

(71) Applicant: Panasonic Intellectual Property Management Co., Ltd., Osaka (JP)

(72) Inventors: Shigeyuki Okamoto, Hyogo (JP); Yukihiro Yoshimine, Osaka (JP); Yasufumi Tsunomura, Osaka (JP)

(73) Assignee: Panasonic Itellectual Property Management Co., Ltd., Osaka (JP)

( * ) Notice: Subject to any disclaimer, the term of this patent is extended or adjusted under 35 U.S.C. 154(b) by 104 days.

(21) Appl. No.: 15/197,758

(22) Filed: Jun. 30, 2016

(65) Prior Publication Data

US 2016/0329449 A1    Nov. 10, 2016

Related U.S. Application Data

(63) Continuation of application No. 12/438,384, filed as application No. PCT/JP2007/066458 on Aug. 24, 2007, now Pat. No. 9,660,120.

(30) Foreign Application Priority Data

Aug. 25, 2006 (JP) ................. 2006-229209

(51) Int. Cl.
  *H01L 31/05* (2014.01)
  *H01L 31/0224* (2006.01)
  *H01L 31/0747* (2012.01)
  *H01L 31/048* (2014.01)

(52) U.S. Cl.
  CPC .. *H01L 31/0512* (2013.01); *H01L 31/022425* (2013.01); *H01L 31/0481* (2013.01); *H01L 31/0747* (2013.01); *Y02E 10/50* (2013.01)

(58) Field of Classification Search
  CPC ... H01L 31/00; H01L 31/02; H01L 31/02002; H01L 31/02008; H01L 31/0201; H01L 31/02013; H01L 31/0224; H01L 31/022425; H01L 31/022433; H01L 31/05; H01L 31/0508; H01L 31/0512
  See application file for complete search history.

(56) References Cited

U.S. PATENT DOCUMENTS

| | | | |
|---|---|---|---|
| 5,084,107 A | 1/1992 | Deguchi et al. |
| 5,344,498 A | 9/1994 | Inoue |
| 5,480,494 A | 1/1996 | Inoue |
| 2003/0216505 A1 | 11/2003 | Akiba et al. |
| 2005/0109389 A1 | 5/2005 | Middelman et al. |

(Continued)

FOREIGN PATENT DOCUMENTS

| | | |
|---|---|---|
| JP | 60-239067 A | 11/1985 |
| JP | 09-260707 A | 10/1997 |
| JP | 11-135812 A | 5/1999 |
| JP | 2000-261012 A | 9/2000 |

(Continued)

OTHER PUBLICATIONS

Notice of Allowance issued in U.S. Appl. No. 12/438,384 dated Feb. 23, 2017.

(Continued)

*Primary Examiner* — Christina Chern
(74) *Attorney, Agent, or Firm* — McDermott Will & Emery LLP

(57) ABSTRACT

A solar cell module includes a plurality of solar cells 1 connected to each other in a way that bus bar electrode 21 formed on surfaces of adjacent solar cells 1 are connected to each other with wiring members 41,42. The bus bar electrode 21 is embedded in the wiring member 41, and the solar cell 1 and the wiring member 41 are bonded together with a resin.

20 Claims, 13 Drawing Sheets

(56) References Cited

U.S. PATENT DOCUMENTS

| | | |
|---|---|---|
| 2005/0115602 A1 | 6/2005 | Senta et al. |
| 2005/0199279 A1 | 9/2005 | Yoshimine et al. |
| 2006/0090791 A1 | 5/2006 | Gaudiana et al. |
| 2010/0126551 A1 | 5/2010 | Okamoto et al. |

FOREIGN PATENT DOCUMENTS

| | | |
|---|---|---|
| JP | 2002-043597 A | 2/2002 |
| JP | 2002-151712 A | 5/2002 |
| JP | 2002-359388 A | 12/2002 |
| JP | 2005-101519 A | 4/2005 |
| JP | 2005-340756 A | 12/2005 |
| WO | 2005/093855 A1 | 10/2005 |

OTHER PUBLICATIONS

Non-Final Office Action issued in U.S. Appl. No. 12/438,384, dated May 11, 2011.
Final Office Action issued in U.S. Appl. No. 12/438,384, dated Jan. 31, 2012.
Non-Final Office Action issued in U.S. Appl. No. 12/438,384, dated Oct. 9, 2012.
Final Office Action issued in U.S. Appl. No. 12/438,384, dated Apr. 23, 2013.
Non-Final Office Action issued in U.S. Appl. No. 12/438,384, dated Dec. 18, 2013.
Final Office Action issued in U.S. Appl. No. 12/438,384, dated Aug. 25, 2014.
Non-Final Office Action issued in U.S. Appl. No. 12/438,384, dated Dec. 3, 2014.
Final Office Action issued in U.S. Appl. No. 12/438,384, dated Aug. 10, 2015.
Non-Final Office Action issued in U.S. Appl. No. 12/438,384, dated Jan. 25, 2016.
Final Office Action issued in U.S. Appl. No. 12/438,384, dated Jul. 14, 2016.
Par, Y. W., Narayanan, T.S.N., Lee, K.Y., "Effect of Temperature on the fretting corrosion of tin plated copper alloy contacts," Wear, vol. 262, Jul. 11, 2006, p. 320-330.

USING TAB HAVING 2 mm WIDTH
AND 0.2 mm THICKNESS

SOLAR CELL MODULE AND SOLAR CELL MODULE MANUFACTURING METHOD

This application is a continuation of application Ser. No. 12/438,384, filed on Apr. 6, 2009, which is a national stage of International Application No. PCT/JP2007/066458, filed on Aug. 24, 2007, entitled "SOLAR CELL MODULE AND SOLAR CELL MODULE MANUFACTURING METHOD" which claims priority based on Article 8 of Patent Cooperation Treaty from prior Japanese Patent Application No. 2006-229209filed on Aug. 25, 2006, the entire contents of which is incorporated herein by reference.

TECHNICAL FIELD

The present invention relates to a solar cell module including a plurality of solar cells connected with each other in a manner that collecting electrodes formed on the surfaces of adjacent solar cells are connected to each other with an electric conductor, and the method for producing the solar cell module.

BACKGROUND OF THE INVENTION

A solar cell is expected as a new energy source because it can directly convert light from the sun, which is clean and inexhaustible energy source, into electricity.

Output per solar cell is as small as several W. Accordingly, when used for a power source of houses or buildings, such solar cells are usually used as a solar cell module in which the output is increased to several hundreds W by electrically connecting the plurality of solar cells in series or in parallel. FIG. 1 is a view showing a part of a conventional solar cell module. FIG. 2 is a cross-sectional view taken along line X-X' of FIG. 1. The plurality of solar cells 101 are electrically connected with each other in a manner that collecting electrodes (finger electrodes 111 or bus bar electrodes 121) formed respectively on the surfaces of the solar cells 101 are connected to each other with wiring members 141. The collecting electrodes are print-formed in a width roughly equal to or wider than the width of the wiring members 141.

Here, each of the wiring members 141 is an electric conductor in which the periphery of a low resistive body 141a made of copper or the like is coated with a solder 141b of tin, silver, copper or the like, as shown in FIG. 2. In addition, the solar cell 101 is sealed by a translucent filling material, such as EVA, which is filled between a translucent surface member such as glass or transparent plastic, and a back surface member made of a resin film such as polyethylene terephthalate film, a steel plate or a glass plate. Here, linear expansion coefficients of the wiring member 141 being a copper foil, for example, and the solar cell 101 formed of a crystal silicon substrate are 17.8 ppm/° C. and 4.2 ppm/° C., respectively, and differ by a factor of more than four. Accordingly, the degrees of expansion and shrinkage due to heating and cooling at a time of soldering to connect the wiring member 141 to the bus bar electrode 121 formed on the solar cell 101 differ among these materials. As a result, warping stress is generated in the solar cell 101, so that a cell crack or an electrode peeling occurs. Particularly, as a thickness of the solar cell becomes thinner in order to reduce the production cost of the solar cell, this problem becomes more significant, and thus there has been a problem of decreasing production yield by a solar cell crack and the like.

Moreover, when the solar cell module is designed to increase output thereof by increasing thickness of the wiring member for reducing serial resistance of the wiring member, a problem of easily generating warpage of a solar cell has also existed in a similar way.

In addition, a lead-tin eutectic solder having a eutectic point of a melting point of 183° C., and having high reliability and good workability has been used conventionally as adhesive material of the wiring member in modularization of solar cells; however, in recent years, replacement to solder materials without containing lead has been promoted in order to protect the environment. Nowadays, a tin-silver-copper eutectic solder having a eutectic point of a melting point of 217° C. is used in many cases. In solder bonding operation using the tin-silver-copper eutectic solder, heating to approximately 240° C. is generally performed. Thus, an operation temperature which is approximately 30° C. or more higher than that of a conventional lead-tin eutectic solder has made it more difficult to solve the warpage problem of the above-described solar cell.

Meanwhile, a solar cell device aiming to resolve the solar cell crack problem caused by thickening the copper foil used for a conventional wiring member has been suggested (for example, see Patent Document 1).

This suggested solar cell device is a solar cell device in which a plurality of solar cells are connected to each other by wiring members in a manner that: the wiring members having approximately the same length are soldered in advance to each of the solar cells; and thereafter, the wiring members connected to a light-receiving surface side of a solar cell and to a back surface side of another solar cell are connected by another wiring member.

According to this method, the separate wiring members are connected to the electrodes of the light-receiving surface sides and the back surface sides, and then these wiring members are connected to each other. Accordingly, compression stress applied to one solar cell by thermal expansion and shrinkage of the wiring members is limited to compression stress caused in only the one solar cell. As a result, the solar cell crack is resolved because the adjacent solar cells are not pulled towards each other.

Patent Document 1: Japanese Patent Application Publication No. 2002-3593139

DISCLOSURE OF THE INVENTION

However, in the above-described Patent Document 1, the solar cell crack is prevented in a way that compression stress applied to one solar cell is limited to compression stress caused in only the one solar cell. Accordingly, when a substrate of the solar cell is thin, a cell crack may possibly occur due to warpage of a substrate even with the stress caused in only one solar cell. As a thickness of the wiring member becomes thicker, a possibility of the solar cell crack becomes much higher.

Consequently, in consideration of the above-described issue, an object of the present invention is to provide a solar cell module configured to suppress occurrences of a warping stress, a cell crack, an electrode peeling and the like which become more significant with reduction of the thickness of the solar cell or with increase of the thickness of the wiring member, and a method for producing the solar cell module.

According to a first aspect of the present invention, a solar cell module comprising: a plurality of solar cells each having a collecting electrode formed on a surface thereof; and an electric conductor connecting the collecting electrode of a solar cell and the collecting electrode of an adjacent solar cell. The collecting electrode of the solar cell is embedded in the electric conductor. The solar cell and the electric conductor are bonded together with a resin.

In the solar cell module according to the first aspect of the present invention, the resin which allows bonding at a lower temperature than that in alloy bonding by solder is used as an adhesion material for the collecting electrode and the electric conductor. Accordingly, occurrences of a warping stress, a cell crack, an electrode peeling and the like which become more significant with making the solar cell thinner or increasing thickness of the wiring member can be suppressed.

In addition, in the solar cell module according to the first aspect, the resin may cover the side surface of the collecting electrode.

According to this solar cell module, the occurrences of a warping stress, a cell crack, an electrode peeling and the like can be further suppressed, and water penetration can be prevented.

Moreover, in the solar cell module according to the first aspect, the resin may contain fine particles.

According to this solar cell module, the resin covers the periphery of the collecting electrode and bonds the electric conductor and the solar cell, so that the water penetration can be prevented and adhesion of the electric conductor can be enhanced.

According to a second aspect of the present invention, a method for producing a solar cell module, comprises the steps of: forming a collecting electrode on a surface of a solar cell; disposing a resin so as to cover the collecting electrode; disposing an electric conductor on the resin, the electric conductor being to be connected to a collecting electrode formed on a surface of an adjacent solar cell; and heating the solar cell module with application of pressure in a direction from an upper part of the electric conductor to the solar cell.

In the method for producing a solar cell module according to the second aspect, the resin which allows bonding at a lower temperature than that in alloy bonding by solder is used as an adhesion material for the collecting electrode and the electric conductor. Accordingly, occurrences of a warping stress, a cell crack, an electrode peeling and the like which become more significant with making the solar cell thinner or increasing thickness of the wiring member can be suppressed.

In the method for producing a solar cell module according to the second aspect, the electric conductor is preferably softer than the collecting electrode of the solar cell at the heating.

According to this method for producing a solar cell module, the collecting electrode is easily embedded inside the electric conductor and adhesion between the collecting electrode and the electric conductor can be further enhanced.

As described above, according to the present invention, it is possible to provide a solar cell module with suppressed occurrences of a warping stress, a cell crack, an electrode peeling and the like which become more significant with making the solar cell thinner or increasing thickness of the wiring member, and also to provide a method for producing the solar cell module.

BEST MODES FOR CARRYING OUT THE INVENTION

Figure 1:
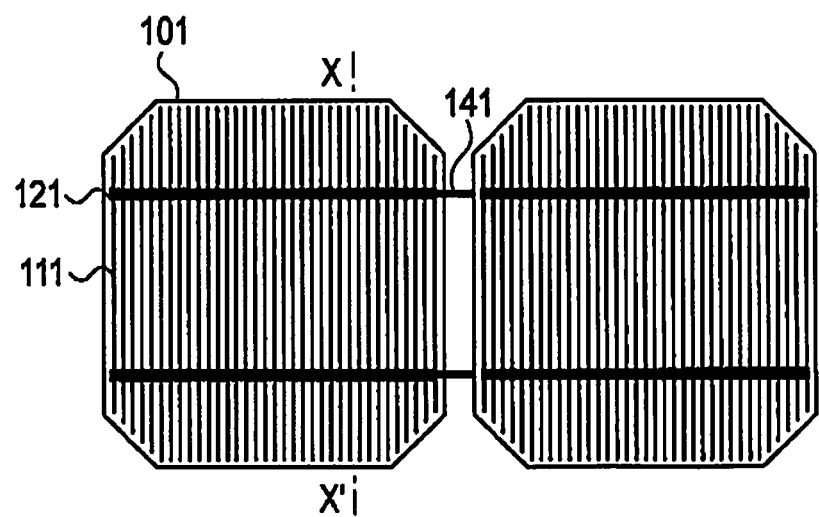
FIG. 1 is a plane view showing a conventional solar cell module.
Figure 2:
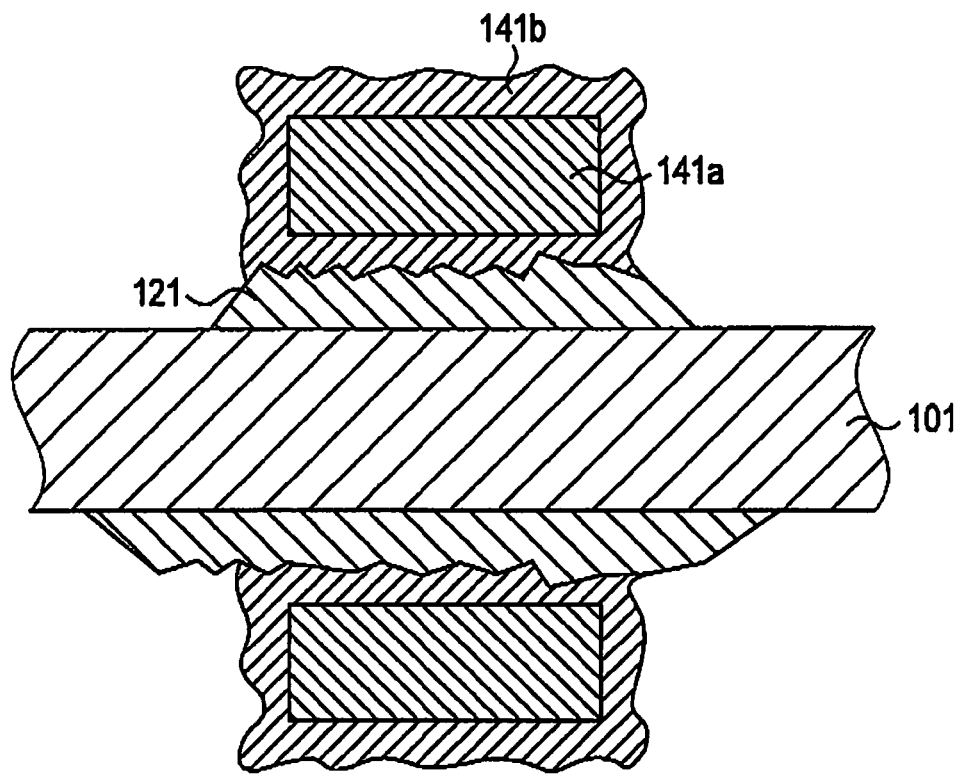
FIG. 2 is a magnified view of X-X' cross-section of FIG. 1.

Next, embodiments of the present invention will be described with reference to the drawings. In the following description of the drawings, the same or similar parts are denoted by the same or similar reference numerals. However, it should be noted that the drawings are schematic, and dimensional proportions and the like are different from their actual values. Accordingly, specific dimension and the like should be determined with reference to the following description. In addition, it is a matter of course that dimensional relationships and dimensional proportions may be different from one drawing to another in some parts.

(Solar Cell Module)

Figure 3:
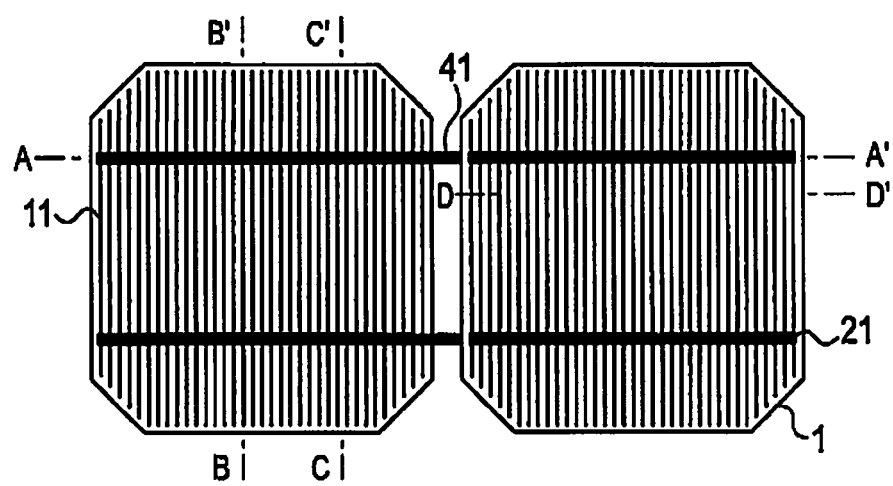
FIG. 3 is a plane view showing a solar cell module according to an embodiment.

A solar cell module according to an embodiment will be described with reference to FIG. 3 to FIG. 7. FIG. 3 is a plane view of solar cells in the solar cell module. FIGS. 4 to 7 are cross-sectional views taken along line A-A', B-B', C-C' and D-D' of FIG. 3, respectively.

A solar cell 1 according to the embodiment is made of a crystal semiconductor, such as a single-crystal silicon semiconductor or a poly-crystal silicon semiconductor, having a thickness of approximately 0.15 mm. The solar cell 1 is an almost square with 125 mm sides. In the solar cell 1, an n-type region and a p-type region are formed, and a semiconductor junction part is formed at an interface of the n-type region and the p-type region. In addition, the solar cell 1 may also have what is called HIT structure, that is, a structure in which a substantially intrinsic amorphous silicon layer is sandwiched between a single-crystal silicon substrate and an amorphous silicon layer, and defects in an interface therebetween is reduced, and properties of a heterojunction interface are improved.

On a light-receiving-surface-side surface (hereinafter referred to as "a light-receiving surface") part of the n-type region in the solar cell 1, a light-receiving-surface collecting electrode is formed. This light-receiving-surface collecting electrode is formed of two bus bar electrodes 21 each connected to a wiring member (an electric conductor) 41 and finger electrodes 11 which are formed so as to intersect the two bus bar electrodes 21 and to branch out therefrom. The two bus bar electrodes 21 are formed throughout almost the entire length of the solar cell 1. A plurality of finger electrodes 11 is formed across almost the entire regions of the solar cell so as to intersect the two bus bar electrodes 21. The two bus bar electrodes 21 are each formed in a width of, for example, approximately 0.3 mm. The finger electrodes 11 are each formed in a width of, for example, approximately 0.1 mm and approximately sixty finger electrodes 11 are formed. Such a light-receiving surface collecting electrode is formed, for example, by screen-printing silver paste and curing at a temperature of a hundred and several tens ° C.

Figure 4:
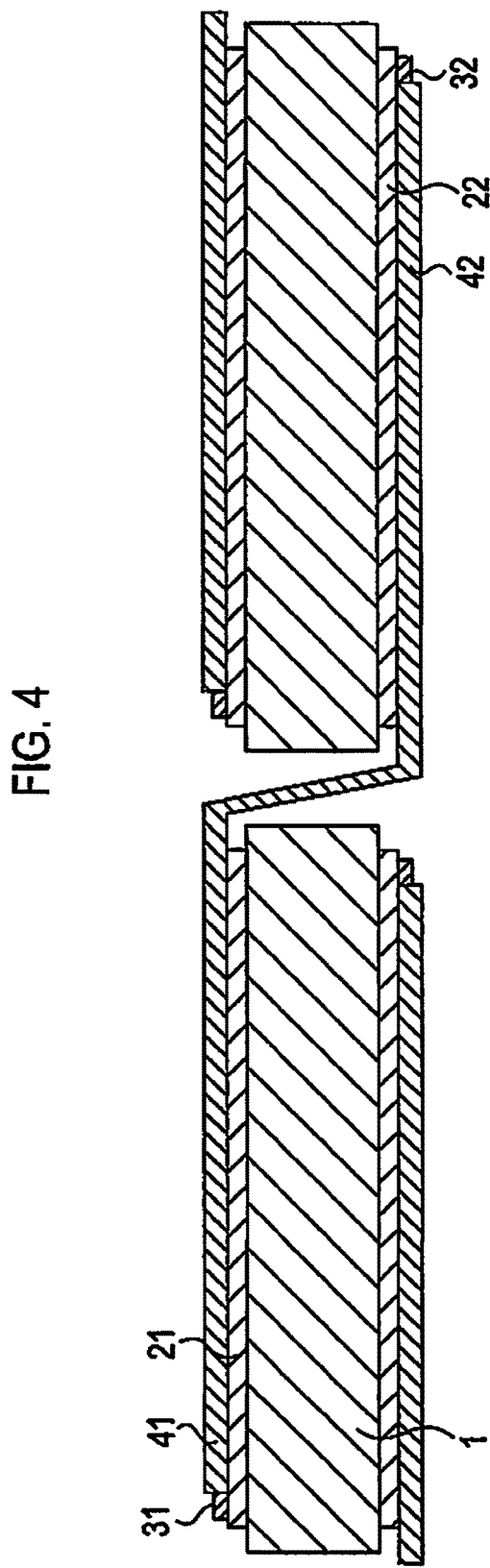
FIG. 4 is a magnified view of A-A' cross-section of FIG. 1.
Figure 5:
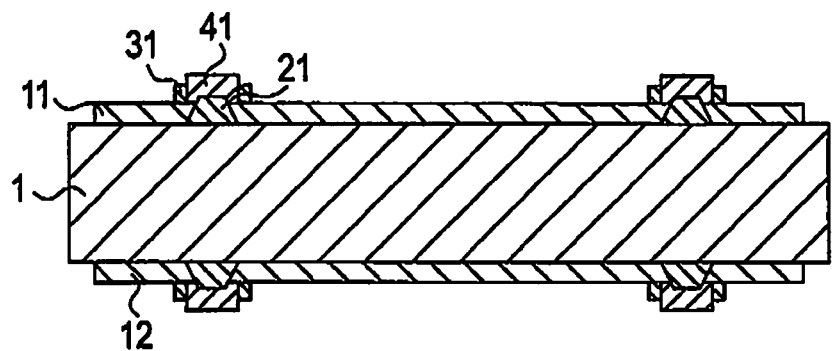
FIG. 5 is a magnified view of B-B' cross-section of FIG. 1.

As shown in FIG. 4, on a surface of back-surface side (hereinafter referred to as "a back surface") of the solar cell 1, a back-surface collecting electrode is also formed in a similar way. This back-surface collecting electrode is formed of bus bar electrodes 22 each to be connected to a wiring member (a electric conductor) 42 and a plurality of finger electrodes 12 formed so as to intersect the bus bar electrodes 22 and to branch out therefrom (see FIG. 5). The two bus bar electrodes 22 are formed throughout almost the entire length of the solar cell, and the plurality of finger electrodes 12 is formed across almost the entire regions of the solar cell 1 so as to intersect the bus bar electrodes 22. The bus bar electrodes 22 are each formed in a width of, for example, approximately 0.3 mm. The plurality of finger electrodes 12 is formed in a width of, for example, approximately 0.1 mm and approximately one hundred finger electrodes 12 are formed. Since the back-surfaces side of the solar cell 1 is not required to consider reduction in light-receiving area, more finger electrodes 12 can be formed in back-surface collecting electrode of the solar cell 1 than in the light-receiving-surface collecting electrode, and resistance loss in the back-surfaces collecting electrode side can be reduced. Such back-surfaces collecting electrodes are formed, for example, by screen-printing silver paste and curing at a temperature of a hundred and several tens ° C.

The wiring member 41, 42 is bonded to the light-receiving-surface side and the back-surface side bus bar electrodes 21, 22 through adhesive materials 31, 32, respectively. The adhesive materials 31, 32 contain an epoxy resin as a main component, and a crosslinking accelerator so that crosslinking is rapidly accelerated by heating at 180° and curing is completed in approximately seconds. A thickness of each of these adhesive materials 31, 32 is 0.01 to 0.05 mm, and a width is preferably less than or equal to the width of the wiring member 41, in consideration of incident light shielding. In this embodiment, strip-shaped film sheets each having a width of 1.5 mm and a thickness of 0.02 mm are used as the adhesive materials 31, 32. Although it was described that a adhesive material containing an epoxy resin as a main component was used for the adhesive materials 31, 32, any adhesive material may be used as long as adhesion can be carried out in a temperature lower than the temperature of solder joint, preferably in a temperature of 200° C. or less, and curing is completed within approximately 20 seconds so as not to reduce productivity too much. For example, a thermoplastic adhesive material such as an EVA resin type or synthetic rubber type adhesive materials and a two liquid reaction type adhesive material which is used fox bonding by mixing an epoxy resin, an acrylic resin or an urethane resin as a base resin and a curing agent, and which allows bonding operation in low temperature, as well as a thermosetting resin adhesive material such as an acrylic type resin contributing reduction of thermal stress due to the low curing temperature and a polyurethane type resin adhesive material having high flexibility can be used.

In addition, adhesive materials made of resins may contain fine particles. Size of the fine particles is 2 to 30 μmφ, preferably an average particle diameter of approximately 10 μm. For the fine particles, nickel, gold-coated nickel or a mixture of plastic with an electric conductive metal such as gold-coated particles can be used.

The wiring member 41, 42 is an electric conductor having a width of 2.0 mm and a thickness of 0.15 mm. The wiring member 41, 42 is formed of a copper foil 41a as a core material and a soft electric conductor 41 as a surface layer of the core material. The soft electric conductor 41b is formed by plating tin in a thickness of approximately 10 μm on a surface of the copper foil 41a. The wiring member 41, 42 is used by being bended between adjacent solar cells 1. In this embodiment, although tin is used as the material of the soft electric conductor 41b forming the wiring member 91, 42, basically, it is preferable that a material which is an electric conductor softer than the collecting electrodes (the bus bar electrode 21 or the plurality of finger electrodes 11) and which is softens at the resin adhesive material curing temperature be used. Specifically, as shown in Table 1, soft conductive metals including a eutectic solder, which has a lowered melting point, are also usable.

TABLE 1

| Plating material | Melting temperature | Brinell hardness |
| --- | --- | --- |
| Sn/10Au | 217 | 16 |
| Sn/38Pb | 183 | 10 |
| Sn | 232 | 5 |
| Pb | 327 | 4 |
| In | 156 | 1 |

Figure 6:
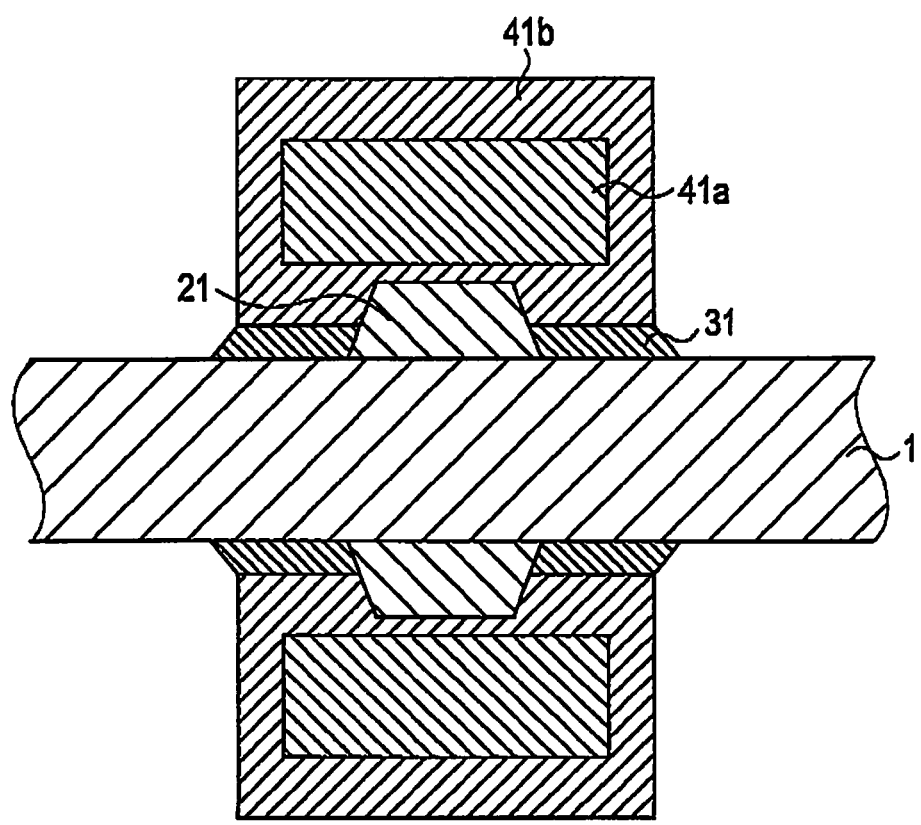
FIG. 6 is a magnified view of C-C' cross-section of FIG. 1.
Figure 7:
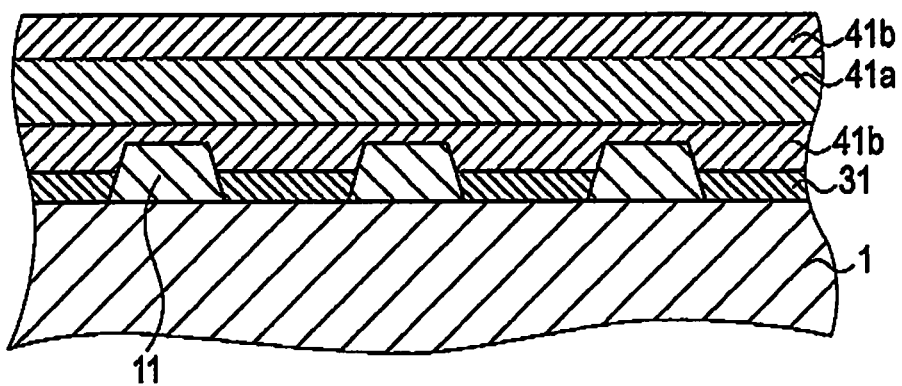
FIG. 7 is a magnified view of D-D' cross-section of FIG. 1.

In addition, for the solar cell module according to the embodiment, as shown in FIG. 6, the bus bar electrode 21 is partially embedded into the soft electric conductor 41b which is a surface layer of the wiring member 41. The light-receiving surface of the solar cell 1 and the wiring member 41 are bonded with the adhesive material 31 made of a resin. In addition, the adhesive material 31 covers the side surface of the bus bar electrode 21. Similarly, as shown in FIG. 7, each of the finger electrodes 11 is partially embedded into the soft electric conductor 41b which is a surface layer of the wiring member 41. The light-receiving surface of the solar cell 1 and the wiring member 41 are bonded with adhesive material 31 made of a resin. In addition, the adhesive material 31 covers a side surface of the finger electrode 11.

In addition to the light-receiving-surface side, the bus bar electrode 22 and each of the plurality of finger electrodes 12 may be partially embedded into the wiring member 42 in the back surface side of the solar cell 1, and the back surface of the solar cell 1 and the wiring member 42 may be bonded with adhesive material 32 made of a resin.

In addition, as shown in FIG. 6 and FIG. 7, in the wiring member 41, the periphery of the low resistive body 41a made of Cu or the like is covered with the soft electric conductor 41b such as tin. Although embedded into the soft electric conductor 41b, the bus bar electrode 21 and the plurality of finger electrodes 11 may be embedded in a depth reaching the low resistive body 41a and bonded.

Moreover, the width and the thickness of the wiring member 41 are also not limited to the values described above. The width and the thickness of the wiring member 41 can be determined such that improvement in the yield and properties is obtained while considering rigidity of the wiring member 41 which is formed of a material of the low resistive body 41a and a material of the soft electric conductor 41b surrounding the low resistive body 41a as well as a resistance value of the wiring member 41 determined by specific resistances of materials and the cross-sectional area.

(Method for Producing Solar Cell Module)

Next, a method for manufacturing the solar cell module according to the present invention will be described using FIG. 8.

First, as shown in FIG. 8(a), the two bus bar electrodes 21 (or the plurality of finger electrodes 11) are formed on the light-receiving surface and the back surface of the solar cell 1. Specifically, the two bus bar electrodes 21 are formed by screen-printing of silver paste and curing at a temperature of a hundred and several tens ° C.

Figure 8:
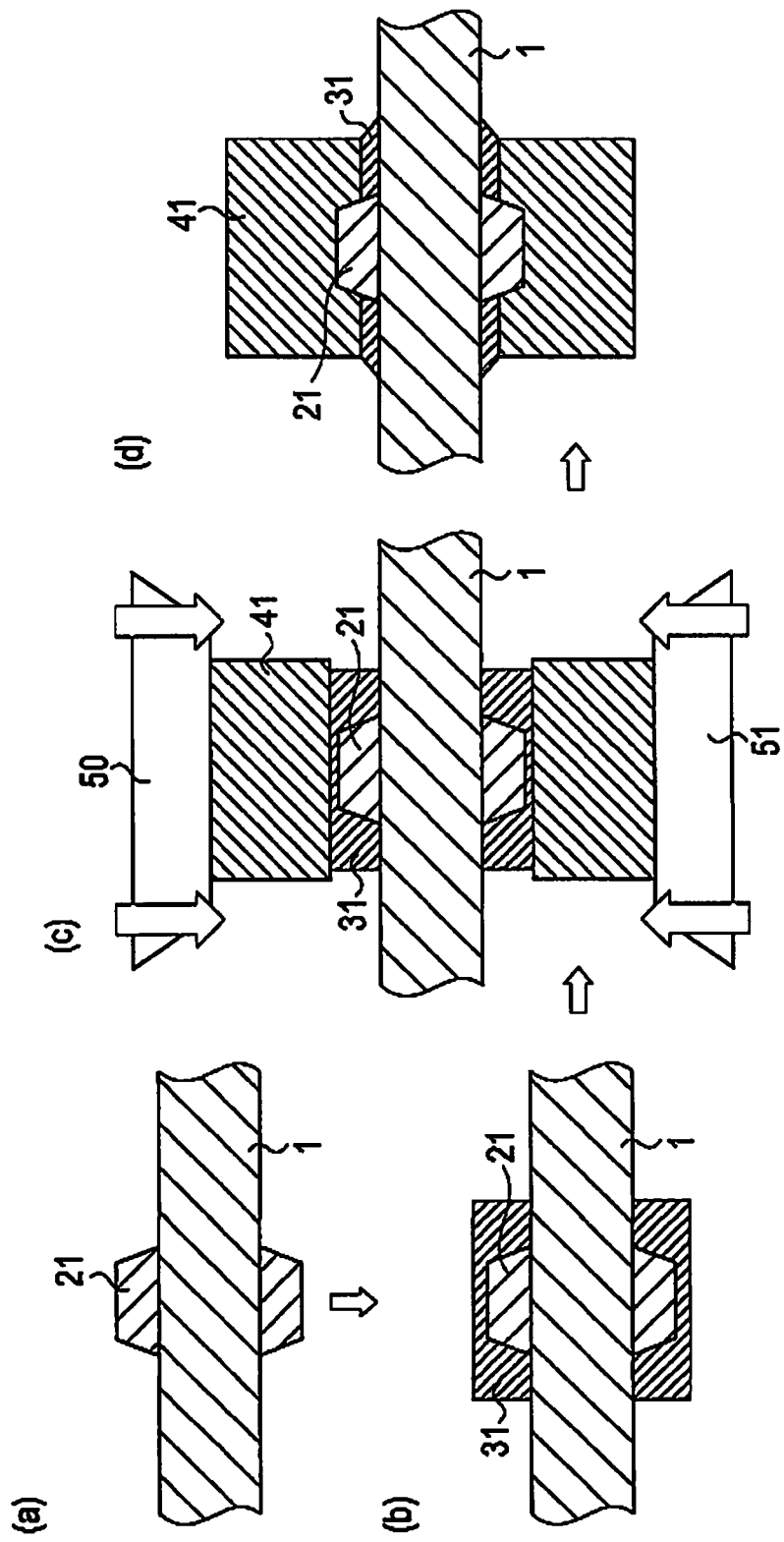
FIG. 8 is a cross-sectional view for illustrating a method for producing a solar cell module according to the embodiment.

Then, as shown in FIG. 8 (b), the adhesive material 31 made of a resin is disposed so as to cover the bus bar electrode 21. Then, the wiring members 41 are stacked on the bus bar electrode 21 in the solar cell 1 and bonded with light pressure.

Then, as shown in FIG. 8 (c), with application of pressure in the direction from the upper part of the wiring member 41 disposed on the adhesive material 31 to the solar cell 1, the aforementioned solar cell 1 is heated. Specifically, the solar cell 1 is set to equipment having a function of constantly maintaining applied pressure and having a structure having upper and lower heater blocks 50, 51 heated at 180° C. Subsequently, the solar cell 1 is clamped, for example, at a pressure of 2 MPa by the upper and lower heater blocks 50, 51, and heated for a time required for curing the adhesive material 31, for example, 15 seconds. At this heating, at least the surface region of the wiring member 41 is preferably softer than the bus bar electrode 21.

Then, as shown in FIG. 8 (d), the bus bar electrode 21 is embedded into the wiring member 41, so that the wiring member 41 and the bus bar electrode 21 are bonded. Detailed description will be made of process of embedding the collecting electrode (the bus bar electrodes), which is made by solidifying silver powder with an epoxy resin as a main component, into tin as a soft electric conductor as described above. Tin, which is the soft electric conductor surrounding the periphery of the wiring member 41, has approximately half hardness compared with silver at ambient temperature. Since the melting point of tin is 232° C., tin becomes softer by being heated at 180° C. Accordingly, by applying a pressure of, for example, 2 MPa to both the wiring members on the front and back sides of solar cell, after fluidly-discharging the resin adhesive, the collecting electrode which is made by solidifying silver particles having a melting point of 963° C. with a thermosetting resin is easily embedded into tin disposed on the surface of the wiring neither.

In a similar way, a second solar cell 1 is stacked on the wiring member 42 and pressure-bonded lightly, and bonding is performed by the above-described procedure, and a desired number of solar cells 1 are bonded.

(Operation and Effect)

It is considered that warpage of a solar cell occurs due to difference between linear expansion coefficients of a wiring member and a solar cell. Since such warpage is proportional to temperature, when the temperature applied to the wiring member and the solar cell become higher, the warpage of the solar cell tends to become larger. Accordingly, it can be said that low temperature adhesion bonding is the most effective means for reduction the warpage of the solar cell.

In the solar cell module according to the embodiment, since a resin which allows bonding to be performed in a lower temperature than that of alloy bonding with solder is used as adhesive material, warping stress on the front and back sides of the solar cell can be lowered, so that occurrence of the warpage of the solar cell can be suppressed.

In addition, since this resin covers the periphery of the collecting electrode and bonds the wiring member and the solar cell, water penetration into the interface of the collecting electrode and the wiring member can be prevented and adhesion of the wiring member can be enhanced.

Generally, when a thermosetting resin adhesive material is being heated, viscosity thereof is lowered once, and then cross-linking is accelerated by a curing agent to complete curing. In the embodiment, the wiring member 41 and the collecting electrode are bonded by embedding the bus bar electrode 21 into the soft electric conductor 41a of the wiring member 41. The resin adhesive material with a viscosity lowered by heating is fluidly-discharged from a bonding part of the wiring member 41 and the collecting electrode. The resin being fluidly-discharged from a bonding part covers a clearance between the wiring member 41 and the collecting electrode balanced with the applied pressure so as to fill the clearance, and, for example, curing is completed 15 seconds after starting pressure adhesion. As the resin adhesive material is cooled after releasing the pressure, the resin shrinks. This shrinkage stress is useful to ensure the electric connection between the wiring members 41, 42 and the corresponding collecting electrodes. That is, the resin adhesive materials filled between the wiring members 41, 42 and the corresponding collecting electrodes so as to cover the bonding parts of the wiring members 41, 42 and the corresponding collecting electrodes have a function for preventing water penetration to the electric connection parts as well as a function of adhesive material. Consequently, oxide formation at the bonded interface can be suppressed and excellent contacting environment can be maintained for a Long period of time. As a result, increase in serial resistance can be prevented and properties of the solar cell module can be maintained.

In addition, for connecting of the solar cells, an electric connection through the wiring member as well as a mechanical connection is required. To obtain a low resistance electric connection, it is important that clean surfaces of each conductive material free from native oxide coat or stain to be bonded are brought into contact with each other. In this embodiment, since the collecting electrode is in the form of being embedded into the soft electric conductor covering the wiring member by being mechanically pressed, sufficient electric connection can be obtained.

In addition to residual stress inevitably existing due to heating and pressurizing, each interface of the wiring member 41 and the solar cell 1 bonded with the resin adhesive material is required to withstand a harsh heating/cooling environment cycle test which simulates a use environment of the solar cell module. That is, in the heating/cooling environment cycle test, the stress generated from difference of linear expansion coefficients is repeatedly applied to each interface. In order to enhance resistance to this stress, the resin adhesive material needs to have not only strong adhesion force but also an adequate elastic modulus that provides resistance against tension, compression, distortion, expansion/contraction ratio and the like. As means for obtaining this adequate modulus, fine particles having different property from the resin and preferably having a diameter of 10 μm are mixed to the resin adhesive material. As a result, the stress resistance can be enhanced without impairing the original adhesion force of the resin. The heterogeneous fine particles mixed into the resin provide an effect in a similar way that the resistance of cement to expansion/contraction, compression and the like is enhanced by adding aggregates or steels to the cement. As a result, long-term reliability of the solar cell module can be improved further.

Moreover, it will be described how the solar cell module according to this embodiment is superior to conventional solar cell modules in low resistance electric connection. In the conventional solar cell connecting using a eutectic solder, a wiring member made by covering the periphery of a material in a thickness of approximately 40 μm which is required for a stable alloy bonding has been used. In contrast, a thickness of the soft electric conductor required in the present invention may be only approximately 1 μm. For a raw material for the wiring member used in the embodiment, tin exhibiting a specific resistance of 11.4 μΩ·cm being approximately one digit higher than the specific resistance of copper of 1.72 μΩ·cm is used. The resistance of entire wiring member can be relatively lowered by reducing the thickness of the soft electric conductor having high resistance compared with the raw material of the wiring member without changing the thickness of entire wiring member including the soft electric conductor, that is, by reducing the component ratio of the soft electric conductor.

(Other Embodiments)

Although the present invention is described in the above embodiment, the description and the drawings composing a part of the disclosure should not be understood to limit the present invention. Various alternative embodiments, examples and operation techniques will become apparent for those skilled in the art from this disclosure.

For example, in the above-described embodiment, the solar cell having the HIT structure has been described as an example. However, the present invention may be applied to a general solar cell of crystal type or thin layer type not having the HIT structure.

In addition, in the embodiment, an example of using the bus bar electrode 21 has been described. However, since contact of the material forming alloy as in conventional means is not required, the bus bar electrode 21 is not always necessary. As described above, the case of a solar cell not having a bus bar electrode will be described with referring to the drawings.

Figure 9:
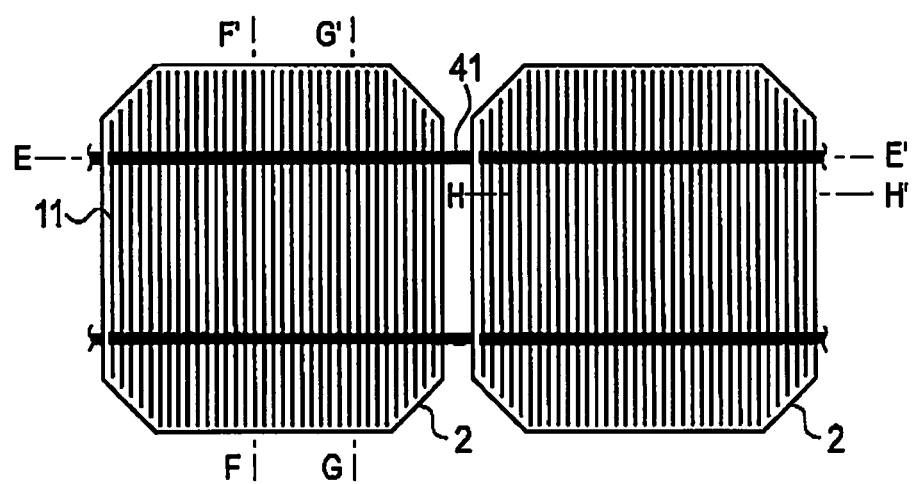
FIG. 9 is a plane view of a solar cell module according to another embodiment.

FIG. 9 is a plane view of a solar cell module including solar cells 2 having only the plurality of finger electrodes 11 as the collecting electrodes.

Figure 10:
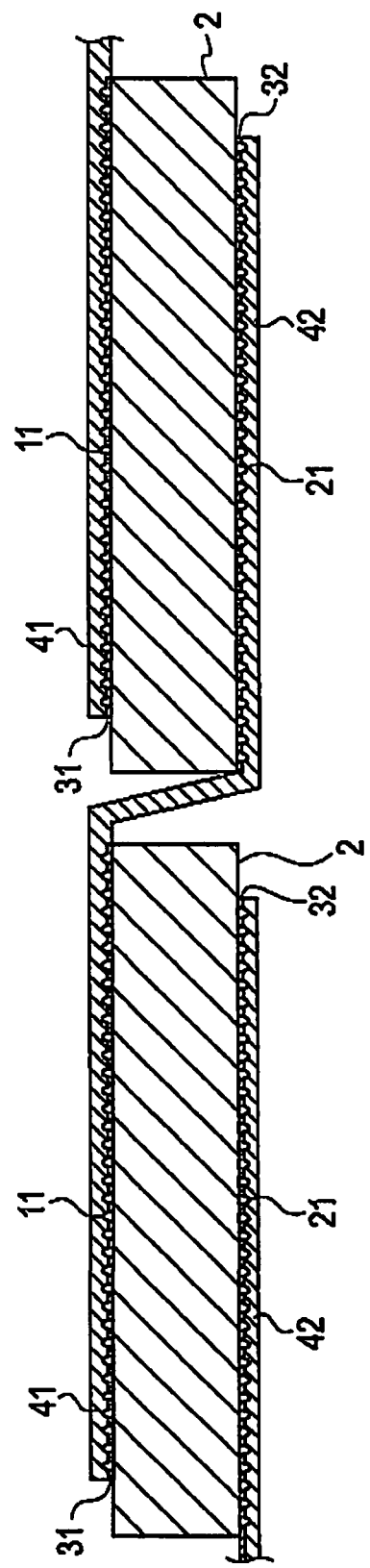
FIG. 10 is a magnified view of E-E' cross-section of FIG. 7.

FIG. 10 is a magnified view of E-E' cross-section of the FIG. 9. As shown in this view, the plurality of finger electrodes 11, 12 as the collecting electrodes are formed on the light-receiving surface and the back surface of the solar cell 2. The light-receiving-surface collecting electrode (the plurality of finger electrodes 11) in one solar cell 2 and the back-surface collecting electrode (the plurality of finger electrodes 21) in the other solar cell 2 adjacent to the one solar cell 2 are electrically connected thorough the wiring members 41, 42.

Figure 11:
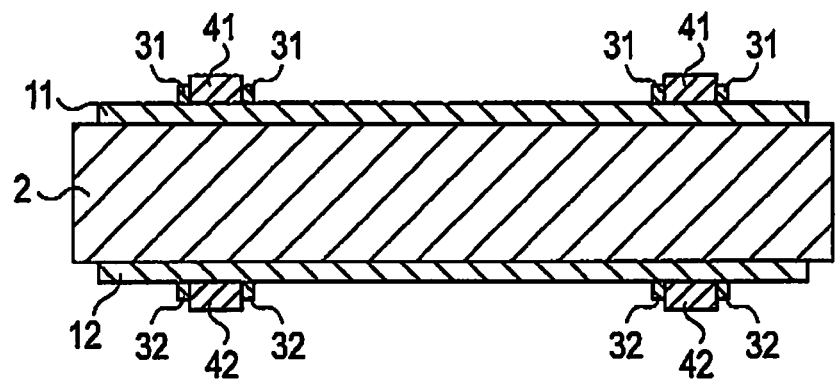
FIG. 11 is a magnified view of F-F' cross-section of FIG. 7.

FIG. 11 is a view of F-F' cross-section of the FIG. 9. As shown in this view, the plurality of finger electrodes 11, 12 and the wiring members 41, 42 are directly connected. By this connecting, electric connection of the plurality of finger electrodes 11, 12 and the wiring members 41, 42 are achieved. The adhesive materials 31, 32 are fluidly-discharged from the contact interfaces of the plurality of finger electrodes 11, 12 and the wiring members 41, 42, and are disposed onto the side surfaces of the wiring members 41, 42. Since contribution of the adhesive materials 31, 32 to the electric connection of the plurality of finger electrodes 11, 12 and the wiring members 41, 42 is small, the adhesive materials 31, 32 may not contain electric conductive particles.

Figure 12:
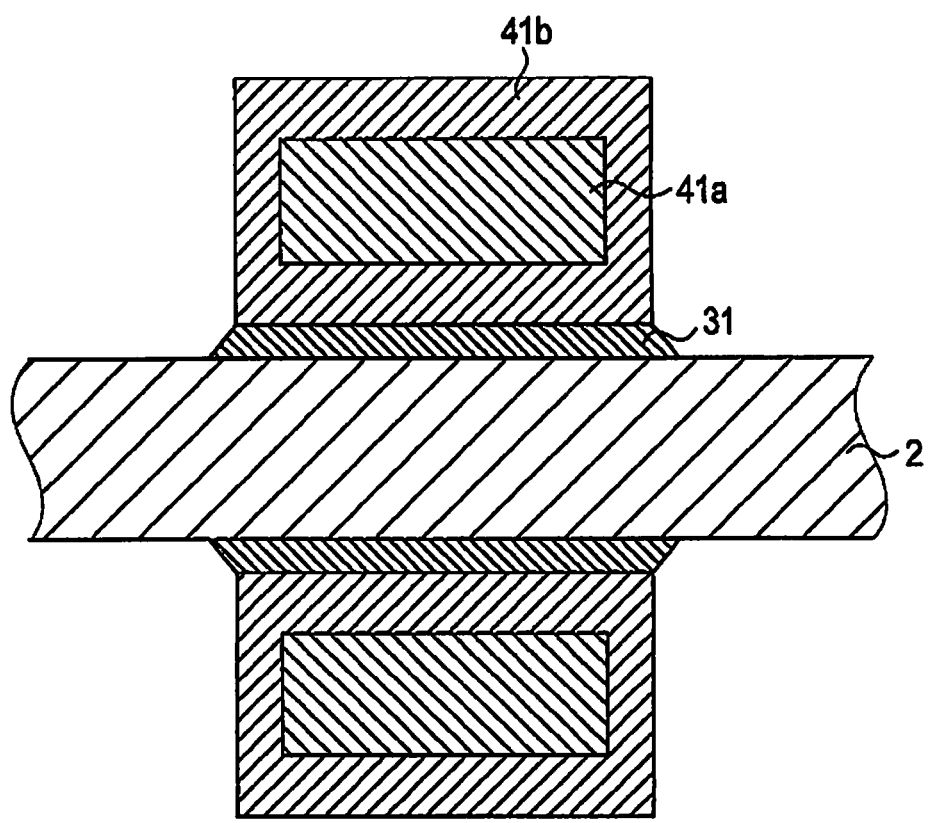
FIG. 12 is a magnified view of G-G' cross-section of FIG. 7.

FIG. 12 is a magnified view of G-G' cross-section of the FIG. 9. As shown in this view, the adhesive material 31 is disposed between the light-receiving surface of the solar cell 2 and the wiring member 41.

Figure 13:
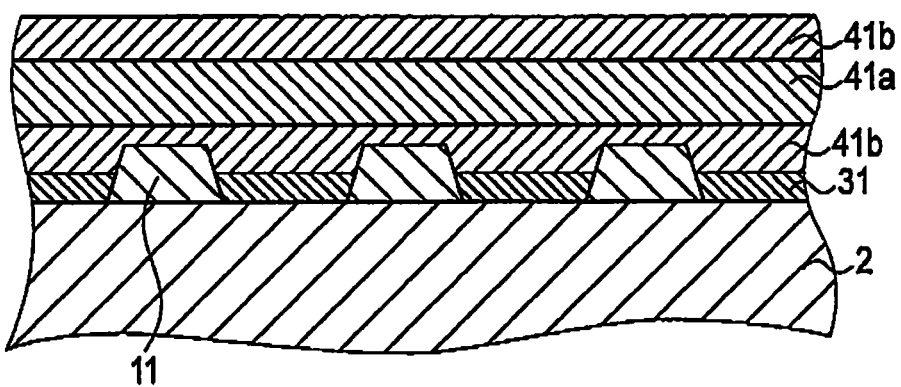
FIG. 13 is a magnified view of H-H' cross-section of FIG. 7.

FIG. 13 is a magnified view of H-H' cross-section of the FIG. 9. As shown in this view, the upper part of each of the plurality of finger electrodes 11 is embedded into the wiring member 41. Specifically, the upper part of each of the plurality of finger electrodes 11 is embedded into the soft electric conductor 41b which is a surface layer of the wiring member 41. As described above, the plurality of finger electrodes 11, 12 and the wiring members 41, 42 are directly bonded by fluidly-discharging the adhesive materials 31, 32 from the contact interfaces of the plurality of finger electrodes 11, 12 and the wiring members 41, 42. By this connecting, the plurality of finger electrodes 11, 12 and the wiring members 41, 42 are mechanically bonded, respectively.

As described above, even when the wiring member 41 is laminated on the collecting electrode only composed of the plurality of finger electrodes 11, comparable mechanical connection can certainly be obtained and comparable electric connection also can be obtained.

In addition, although copper foil is described as a material for the wiring member in the embodiment, the material for the wiring member only needs to have low electric resistance. Thus a material of iron, nickel, silver or a combination thereof provides a similar effect.

Moreover, in the embodiment, although the resin adhesive material has been described in the form of the strip-shaped film sheet formed in advance, the same effect can be obtained even with a paste like resin adhesive material.

In this manner, it goes without saying that the present invention includes various embodiments which are not described here. Accordingly, the technical scope of the present invention is to be determined only by claimed elements of the present invention according to the scope of claims reasonably understood from the above description.

EXAMPLES

A semiconductor light emitting element according to the present invention will be specifically described below with reference to the examples. However, the present invention is not limited to what is shown in the following examples, and can be implemented with alternations made as appropriate within the scope of the invention.

(Actual Measurement of Resistance Values)

Figure 14:
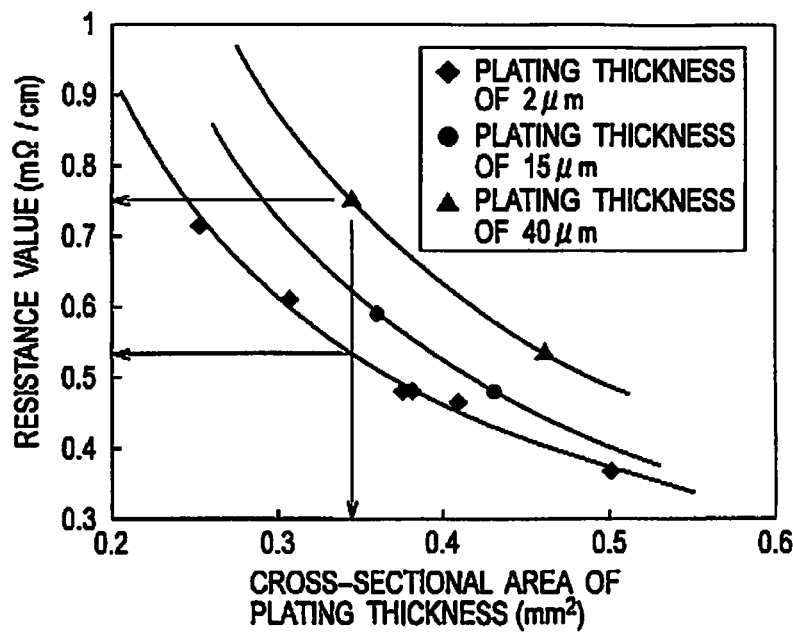
FIG. 14 is a graph showing values of resistance according to Examples.

FIG. 14 shows the entire resistance value of each of the wiring members formed of copper as the raw material of the wiring member and the surrounding soft electric conductor. The resistance value of each of the wiring members varies depending on the difference in the thickness of the soft electric conductor forming the wiring member, even if the entire thicknesses of the wiring members are the same.

Conventionally, a plating thickness of 40 μm has been required to perform soldering. Thus, the resistance values of a material covered with a eutectic solder made of tin, silver and copper of an average thickness of 40 μm (a plating thickness of 40 μm) were plotted as a conventional wiring member. On the other hand, the resistance values of the material obtained by covering the periphery of a copper material with tin in 15 μm thickness (a plating thickness of 15 μm) were plotted as the wiring member according to the present invention. In addition, since approximately 2 μm of the soft electric conductor can provide the effect according to the present invention, the resistance values of the material obtained by covering the periphery of a copper material with tin in 2 μm thickness (a plating thickness of 2 μm) were also plotted. These resistance values were actually measured with a milliohm meter.

It has been described that warping stress is generated by stress caused by expansion and shrinkage at heating and cooling due to balance difference between the cell thickness and the cross-sectional area of the wiring member. Suppose that the cells are set to the same thickness as conventional ones. When the wiring members having the same cross-sectional area as those of conventional ones are used, the high efficient solar cell module is obtained because the low resistance wiring member compared with the conventional wiring member is used. In addition, in contrast, it was found that, in the case of using a thin solar cell, even when a wiring member having a small cross-sectional area is used to prevent a solar cell crack due to warpage, a solar cell module similar to the conventional one can be obtained. As described above, it was found that more significant effect was obtained by relatively increasing a composition ratio of a copper material having low resistance.

(Peeling Strength of Wiring Member)

Figure 15:
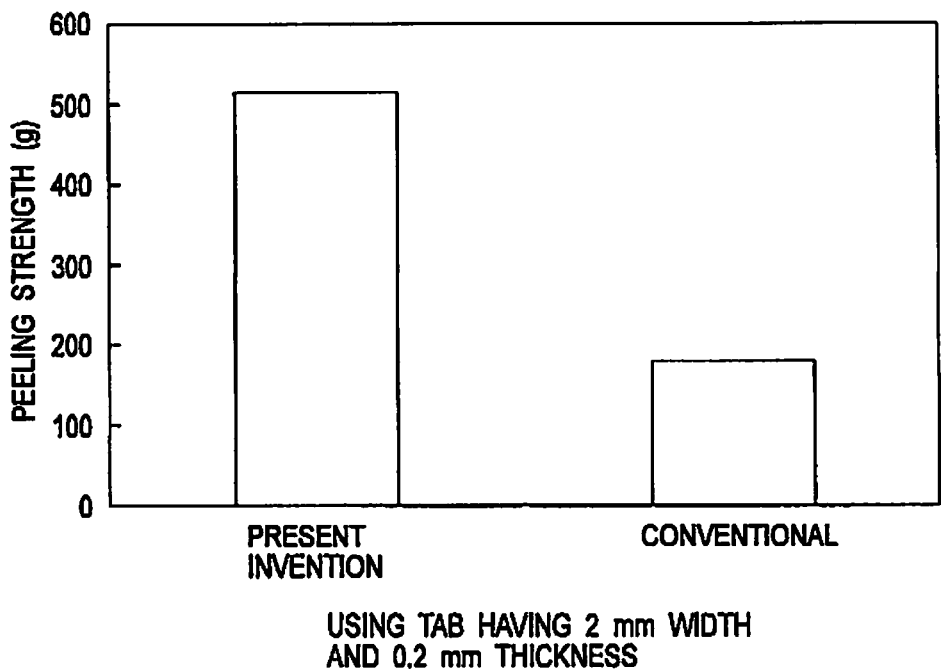
FIG. 15 is a graph showing peeling strength of a wiring member according to Examples.

A collecting electrode having a conventional structure is formed by printing a silver paste on a solar cell in approximately the same dimension of a width of a wiring member, and the wiring member is bonded on this collecting electrode with solder. Accordingly, a mechanical connection strength of the wring material and the solar cell depends on the strength of this print-formed collecting electrode. A mixing ratio of silver particles in the silver paste is required to increase, since low electric resistance and an alloying effect with a eutectic solder are required properties for the collecting electrode. Therefore, adhesion force with the solar cell is obtained in the balance of the above-described electric resistance and the soldering property. Accordingly, the obtained adhesion force is low compared with the adhesive material made of a resin as a main component according to the embodiment. Specifically, as shown in FIG. 15, when peeling strengths of wiring member of the present invention and the conventional structure were compared, approximately three times difference in average values existed.

Here, measuring method of peeling strengths of wiring member will be described.

First, as a preparation, a solar cell was flatly placed on a planner stage. Then, while pushing a tool, such as a metal ruler, having a sharply-angled edge at approximately 10 mm from the and to the solar cell, the wiring member was gently peeled to the edge. Then, after the wiring member peeled to approximately 10 mm was clamped with a sample clamp equipped to a force gage, which can measure up to 1 kg, had a hold function at maximum torque, and was equipped in a vertical direction, the metal ruler was removed. Then, measurement was performed by pulling the force gage up in a vertically upward direction while a part of the solar cell close to the wiring member subjected to the peeling strength measurement was pushed to the planner stage. Measurement of each wiring member was performed at three positions located at approximately 10 mm away from one of the ends of the solar cell and approximately center from the both ends.

(Solar Cell Properties)

Figure 16:
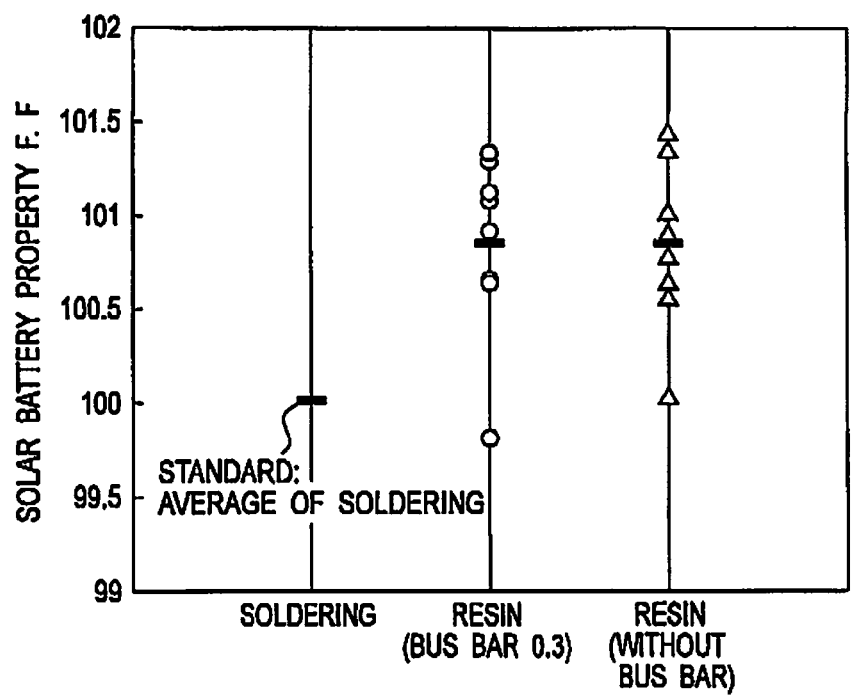
FIG. 16 is a graph showing solar cell properties according to Examples.

The graph shown in FIG. 16 shows, by using the actual measurement data, that the resistance value of each wiring member is different due to difference of the soft conductive plating layer thickness, even when the entire thickness of each wiring member is the same. Here, solar cell properties, i.e., F. F (fill factor), were compared in order to describe contribution of the present invention to the solar cell properties. F. F is one of the properties depending on serial resistance of a solar cell.

For a conventional example, a wring material formed of a material covered with the eutectic solder made of tin, silver and copper of an average thickness of 40 μm (a plating thickness of 40 μm) was used. A width of the wring material of the conventional example was 2 mm, and a thickness was 0.15 mm. On the other hand, a wiring member obtained by covering the periphery of a copper material with tin in 15 μm thickness (a plating thickness of 15 μm) was used as an example. A width of the wring material of the example was 2 mm, and a thickness was 0.20 mm. Accordingly, the total thickness of each of the wiring members, in which the plating thickness and the copper material thickness are added, is 0.23 mm for both the example and the conventional example. In addition, as for the example, two types of solar cells, that is, the case of using a bus bar having 0.3 mm width and the case of without a bus bar, were prepared.

The F. F values in the conventional example (soldering), the example with bus bar, and the example without bus bar are shown in FIG. 16. The F. F values are normalized by setting the average value of five samples of the conventional example as 100.

As shown is this figure, it is found that the solar cells according to the examples provide high F. F values compared with the solar cell according to the conventional example because the solar cells according to the examples used low resistance wiring member.

(Humidity Test)

The humidity test was performed on the examples and the conventional example being the same as those used in the above-mentioned solar cell properties evaluation. As examples, four types of samples, i.e., the cases with bus bars having widths of 0.3 mm, 1.0 mm and 1.8 mm and the case without bus bar, were prepared.

Figure 17:
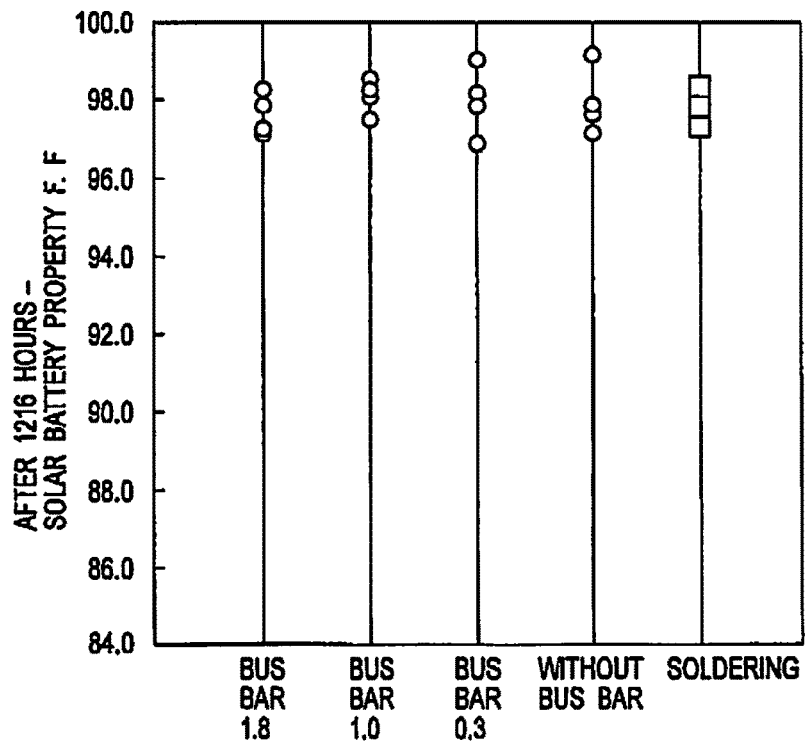
FIG. 17 is a graph showing solar cell properties after a humidity test according to Examples.

F. F values after exposure of the examples and the conventional example to the environment of a temperature of 85° C. and a humidity of 85% for 1216 hours are shown in FIG. 17. F. F values after the humidity test were normalized by taking the F. F value before the humidity test as 100 and are represented in FIG. 17.

As shown in FIG. 17, it was revealed that the examples had the same humidity resistance as that of the conventional example. Accordingly, considering the evaluation result of the solar cell properties shown in FIG. 16, it was found that the examples could retain the high F. F values compared with the conventional example, even after the humidity test.

In particular, it was revealed that the sufficient mechanical connection and the electric connection of the plurality of finger electrodes and the wiring member were also obtained in the example without bus bar.

(Thermal Cycle Test)

The thermal cycle test was performed on the examples and the conventional example being the same as those used in the above-mentioned humidity test. As examples, four types of samples, i.e., the cases with bus bars having widths of 0.3 mm, 1.0 mm and 1.8 mm and the case without bus bar, were prepared.

For the thermal cycle test, a method compliant with the thermal cycle test of JIB C8917 was used. Specifically, one cycle (6 hours) was composed of raising temperature from 25° C. to 90° C. over 45 min, maintaining this temperature for 90 min, then lowering temperature to −40° C. over 90 min, maintaining this temperature for 90 min, and then raising temperature to 25° C. over 45 min, and this cycle was repeated 265 times.

Figure 18:
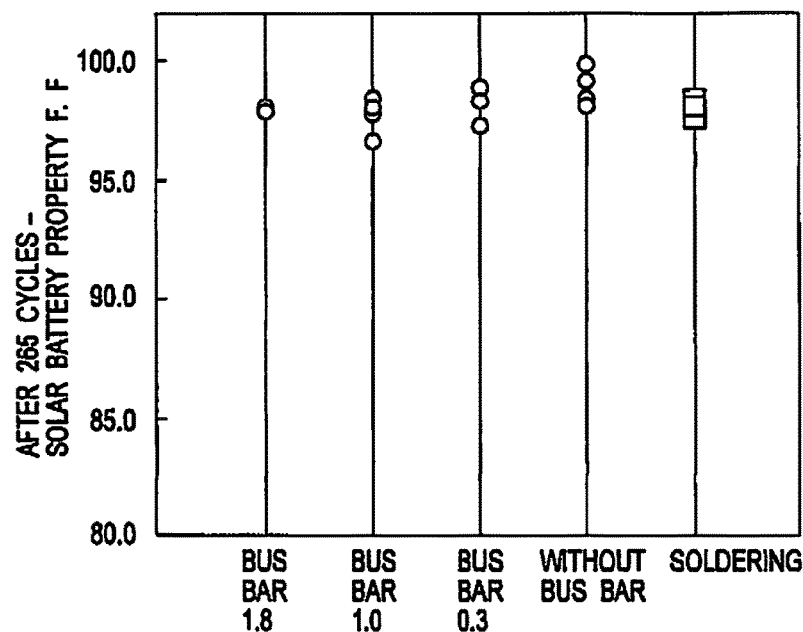
FIG. 18 is a graph showing solar cell properties after a thermal cycle test according to Examples.

FIG. 18 shows F. F values of the examples and the conventional example after repeating 265 cycles. F. F values after the thermal cycle test were normalized by taking the F. F value before the thermal cycle test as 100 and are represented in this figure.

As shown in FIG. 18, it was revealed that the example had the same long-term reliability as that of the conventional example. Accordingly, considering the evaluation result of the solar cell properties shown in FIG. 16, it was found that the examples could retain the high F. F values compared with the conventional example, even after the thermal cycle test.

In particular, it was revealed that the long-term reliability was also maintained in the example without bus bar. The entire content of Japanese Patent Application No. 2006-229209 (filed on Aug. 25, 2006) is incorporated to the specification of the present application by reference.

INDUSTRIAL APPLICABILITY

As described above, the solar cell module according to the present invention is useful, since in the solar cell module occurrences of a warping stress to the solar cell, a cell crack and an electrode peeling can be suppressed.

The invention claimed is:

1. A solar cell module comprising:
a plurality of solar cells;
at least one finger electrode disposed on at least one surface of each of the plurality of solar cells;
an adhesive material provided as a distinct element from the at least one finger electrode, the adhesive material comprising a resin and covering a part of a side surface of the at least one finger electrode; and
an electric conductor connected to the at least one finger electrode, wherein:
the electric conductor covers an upper surface of the at least one finger electrode and a remaining part of the side surface of the at least one finger electrode not covered by the adhesive material, and
the adhesive material bonds the electric conductor to the at least one surface of each of the plurality of solar cells.

2. The solar cell module according to claim 1, wherein the electric conductor connects the at least one finger electrode of one of the plurality of solar cells to the at least one finger electrode of an adjacent one of the plurality of solar cells.

3. The solar cell module according to claim 1, wherein the resin is a thermosetting resin or a thermoplastic resin.

4. The solar module according to claim 1, wherein:
the electric conductor includes an inner core and an outer layer covering the inner core, and
a material of the outer layer is softer than a material of the inner core.

5. The solar cell module according to claim 1, wherein the at least one finger electrode includes at least one first finger electrode and at least one second finger electrode and the at least one surface of each of the plurality of solar cells includes a light-receiving surface and a back surface, the at least one first finger electrode is disposed on the light-receiving surface and the at least one second finger electrode is disposed on the back surface.

6. The solar cell module according to claim 5, wherein the electric conductor connects the at least one finger electrode on the light-receiving surface of one of the plurality of solar cells to the at least one finger electrode on the back surface of an adjacent one of the plurality of solar cells.

7. The solar cell module according to claim 5, wherein:
the at least one first finger electrode includes a plurality of first finger electrodes disposed on the light-receiving surface and the at least one second finger electrode includes a plurality of second finger electrodes disposed on the back surface, and
a total number of the plurality of second finger electrodes disposed on the back surface is greater than a total number of the plurality of first finger electrodes disposed on the light-receiving surface.

8. The solar cell module according to claim 1, wherein:
the electric conductor includes an inner core and an outer layer covering the inner core, and
the at least one finger electrode is in direct contact with the inner core.

9. The solar cell module according to claim 1, wherein:
the electric conductor includes an inner core and an outer layer covering the inner core, and
the at least one finger electrode is not in direct contact with the inner core.

10. The solar cell module according to claim 1, wherein the at least one surface of each of the plurality of solar cells is flat.

11. The solar cell module according to claim 1, wherein the adhesive material includes no conductive particle.

12. The solar cell module according to claim 1, wherein the electric conductor is not in direct contact with the at least one surface of each of the plurality of solar cells.

13. The solar cell module according to claim 1, wherein:
the at least one finger electrode includes a plurality of finger electrodes disposed on the at least one surface, and
no bus bar electrode that connects the plurality of finger electrodes and is in direct contact with the at least one surface is provided.

14. A solar cell module comprising:
a solar cell;
finger electrodes disposed on a surface of the solar cell;
an adhesive material provided as a distinct element from the finger electrodes, the adhesive material comprising a resin and covering a lower part of side surfaces of the finger electrodes; and
an electric conductor connecting the finger electrodes, wherein:
no bus bar electrode that connects the finger electrodes and is in direct contact with the surface of the solar cell is provided,
the electric conductor covers upper surfaces of the finger electrodes and a remaining part of the side surfaces of the finger electrodes not covered by the adhesive material, and the adhesive material is disposed between the electric conductor and the surface of the solar cell and bonds the electric conductor to the surface of the solar cell.

15. The solar cell module according to claim 14, wherein the finger electrodes are in direct contact with the surface of the solar cell.

16. The solar cell module according to claim 14, wherein the electric conductor intersects the finger electrodes.

17. The solar cell module according to claim 14, wherein the solar cell has a structure in which a substantially intrinsic amorphous silicon layer is sandwiched between a single-crystal silicon substrate and an amorphous silicon layer.

18. The solar cell module according to claim 14, wherein the finger electrodes contain Ag.

19. The solar cell module according to claim 14, wherein the adhesive material includes conductive particles.

20. The solar cell module according to claim 14, wherein a thickness of the adhesive material is smaller than a thickness of the finger electrodes.

* * * * *